United States Patent [19]

Huie et al.

[11] Patent Number: 5,045,492

[45] Date of Patent: Sep. 3, 1991

[54] METHOD OF MAKING INTEGRATED CIRCUIT WITH HIGH CURRENT TRANSISTOR AND CMOS TRANSISTORS

[75] Inventors: Wing K. Huie, North Wales, Pa.; Alexander H. Owens, Pennington, N.J.; David S. Pan, Fremont, Calif.

[73] Assignee: Allegro Microsystems, Inc., Worcester, Mass.

[21] Appl. No.: 411,785

[22] Filed: Sep. 25, 1989

[51] Int. Cl.$^5$ ............................................. H01L 21/76
[52] U.S. Cl. ......................................... 437/57; 437/63; 437/69; 437/31; 148/DIG. 86
[58] Field of Search .................. 437/56, 57, 34, 31, 437/26, 63, 69; 357/42, 44; 148/DIG. 86

[56] References Cited

U.S. PATENT DOCUMENTS

| | | | |
|---|---|---|---|
| 4,458,158 | 7/1984 | Mayrand | 307/270 |
| 4,604,790 | 8/1986 | Bonn | 29/576 B |
| 4,622,738 | 11/1986 | Gwozdz et al. | 437/69 |
| 4,628,341 | 12/1986 | Thomas | 357/42 |
| 4,646,124 | 2/1987 | Zunino | 357/43 |
| 4,734,382 | 3/1988 | Krishna | 437/31 |
| 4,887,142 | 12/1989 | Bertotti et al. | 357/44 |

OTHER PUBLICATIONS

R. A. Colclaser, Microelectronics: Processing and Device Design, 1980, pp. 128-129.

Primary Examiner—Brian E. Hearn
Assistant Examiner—Chandra Chaudhari

[57] ABSTRACT

A method for making an integrated circuit includes forming patches of a silicon nitride mask over the areas where a high-current vertical DMOS and/or NPN transistor, where a vertical NPN transistor and where the NMOS and PMOS transistors of a CMOS pair are to be formed. The nitride mask also includes patches over a network of P-type isolation walls, and two special patches over two special areas at which N+ plugs for the DMOS and NPN transistors are to be formed. A heavy field oxide is grown everywhere except at the nitride patches. The two special patches are selectively removed and by heating and diffusing phosphorous from a POCl$_3$ source from 950° C. to 1100° C. for at least 30 minutes, two very high conductivity N+ phosphorous plugs are formed through the epitaxial layer at a concentration of over $10^{20}$ phosphorous atoms/cm$^3$, while the nitride serves to prevent the sensitive channel regions of the DMOS and CMOS transistors from phosphorous doping. This results in close self-alignment of the N+ plugs and their associated DMOS and NPN transistors leading to low on-resistance, to higher IC component density, to a high throughput rate at manufacturing and low cost.

9 Claims, 2 Drawing Sheets

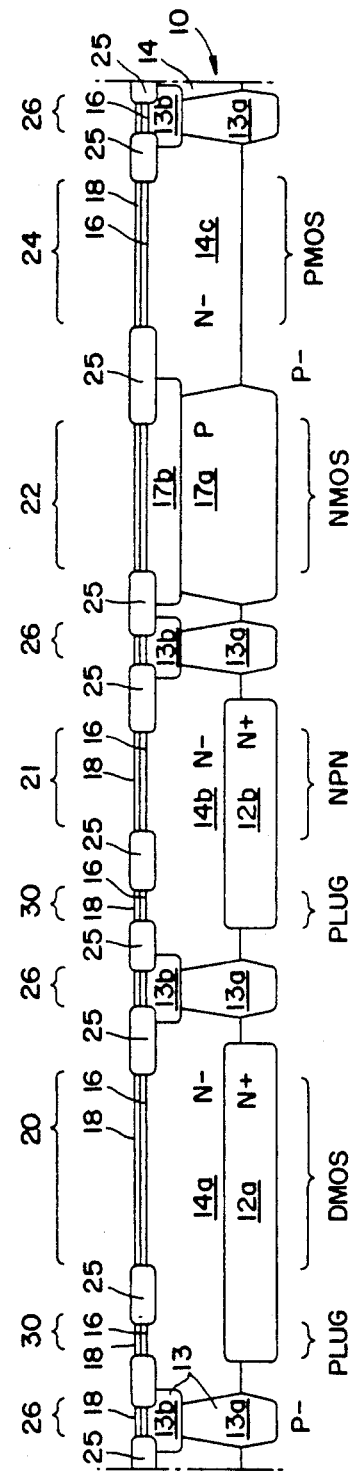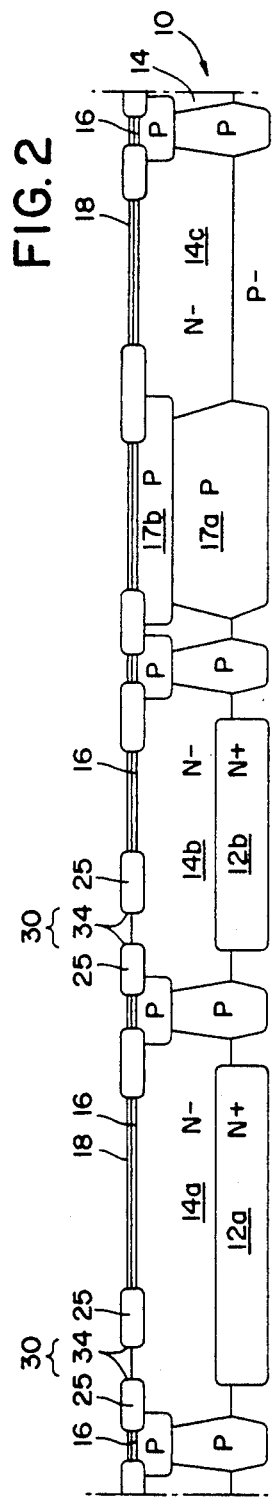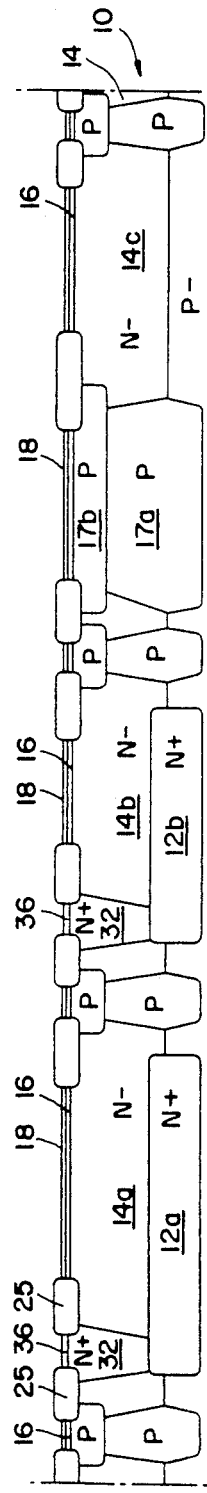

METHOD OF MAKING INTEGRATED CIRCUIT WITH HIGH CURRENT TRANSISTOR AND CMOS TRANSISTORS

BACKGROUND OF THE INVENTION

This invention relates to a method for making a high current handling driver or power transistor in a silicon integrated circuit along with CMOS and other small signal transistors, and more particularly relates to integrated vertical power transistors wherein an N+ buried layer and an N+ plug region provide a low resistivity path for the high transistor load current.

The maximum current that an integrated power transistor can handle safely is directly related to the maximum temperature that is tolerable before it is destroyed. Elevated device temperature is attributable to forward (load) current, high parasite-transistor-current and current at voltage breakdown. As the forward (load) current that a switched driver transistor will be required to carry increases the more important becomes the power dissipation due to forward-current voltage-drop or $V_{SAT}$ across the transistor which is strongly related to the on-resistance through the transistor.

In vertical integrated power transistors, the on-resistance is made as low as possible by forming the transistor in an epitaxial pocket with a heavily doped buried layer that is contacted by a conductive plug accessible at the epitaxial-layer surface.

An NPN power transistor of this kind is described by Zunino in U.S. Pat. No. 4,646,124 issued Feb. 24, 1987 and assigned to the same assignee as is the present invention. Here the N+ buried layer makes broad contact with the N-epitaxial pocket which serves as the power transistor collector.

Another integrated vertical transistor, a power DMOS transistor, is described by Huie et al in a patent application Ser. No. 281,593, filed Dec. 9, 1988 and assigned to the same assignee as is the present invention. This vertical DMOS power transistor handles a high load current and operates at a relatively high voltage (65 volts).

Transistor voltage breakdown is directly related to epitaxial layer thickness. However, the difficulty and cost (e.g. in silicon real estate) of providing a low resistivity plug through the epitaxial layer grows as the epitaxial layer thickness increases. The heavy concentrations of dopants for forming the plug must diffuse further to extend through the epitaxial layer, but also diffuse further laterally to occupy more die surface area.

In U.S. Pat. No. 4,458,158 to Mayrand and assigned to the same assignee as is the present invention there is described another integrated vertical power transistor in which two epitaxial layers are employed. Here, a small auxiliary buried N+ layer is registered with an outer surface N+ plug diffusion that together reach through both epitaxial layers to a main N+ buried layer that serves as collector of the power NPN. However, the double epitaxial layer process may in some cases nullify the cost advantage of the space saving two-component N+ plug.

It is therefore an object of this invention to provide a low cost integrated circuit including small signal transistors with a vertical power transistor with low forward resistance and high current handling capability.

It is another object of this invention to provide such an integrated power transistor having an N+ plug with an abnormally high dopant concentration.

It is a further object of this invention to provide a low cost method for providing such an integrated circuit in which the N+ plug is self-aligned with the power transistor device area.

SUMMARY OF THE INVENTION

A method, for making a silicon integrated circuit die which has a vertical high current transistor and a pair of CMOS transistors, employs standard steps using a silicon nitride mask for selectively growing a thick field oxide or LOCOS (local oxide structure) surrounding and defining the basic device area of the high current transistor and the areas of the CMOS transistors. According to this invention there is also simultaneously defined the separate area of the N+ plug region of the vertical high current transistor. In subsequent steps the nitride is selectively removed over the area of the plug but leaving the other nitride patches and the silicon die is heated in a diffusion furnace with a POCl$_3$-containing atmosphere to provide a low conductivity plug. Ultimately the completed N+ plug contains more than $10^{20}$ phosphorous atoms per cubic centimeter. The combination of the silicon nitride and silicon dioxide mask shield the sensitive transistor device areas from the ambient phosphorous during the long diffusion time and high temperature necessary to achieve such a high concentration of phosphorous atoms in the plug. After removal of the nitride and oxide, a high quality gate oxide is then formed over all device areas and N+ plug areas. This is accomplished in a step the initial phase of which employs a partial steam atmosphere at less than 850° C. to minimize plug phosphorous diffusion and concurrent indiffusion at device areas.

The vertical high-current transistor is then developed through the opening provided therefor in the thick field oxide so that this transistor and its plug are mutually self-registered and can therefore be precisely formed quite close to each other. Since it is preferred to surround the high current transistor with an annular N+ plug, close spacing can save a significant area in the integrated circuit die.

This method preferably includes further costsaving and time-temperature-minimizing features. Accordingly when the high current transistor is a vertical DMOS transistor, the DMOS source is formed simultaneously with the source and drain of the NMOS transistor of the CMOS pair. Similarly, when an NPN transistor is included, the steps for forming the D-well may be those employed for simultaneously forming the NPN base and the emitter of the NPN is also formed at the same time as is the DMOS source.

This method is especially suitable for making integrated circuits wherein the vertical high-current transistor is rated for voltages in the range of 5-25 volts and wherein the epitaxial layer thickness is correspondingly less than 6 microns. This leads to higher conductivity plugs in the high current transistor whether it is a vertical DMOS transistor or a vertical NPN transistor.

BRIEF DESCRIPTION OF THE DRAWING

FIG. 1 shows in side sectional view a portion of a silicon integrated circuit only partially developed by the method of this invention.

FIG. 2 shows the integrated circuit of FIG. 1 further developed and having only two openings in a nitride and LOCOS combination mask ready for the step of diffusing a heavy dose of phosphorous impurities through the two openings to form low conductivity N+ plugs for a high current DMOS transistor and for a vertical NPN transistor.

FIG. 3 shows the integrated circuit of FIG. 2 after the phosphorous diffusion step.

DESCRIPTION OF THE PREFERRED EMBODIEMENTS

Figure 4:
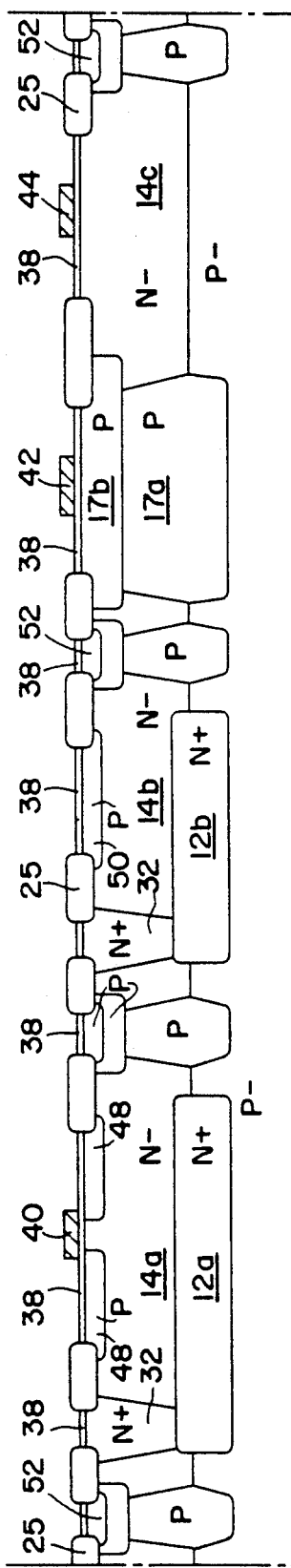
FIG. 4 shows the integrated circuit of FIG. 3 further developed with simultaneously formed gate oxide for DMOS and CMOS transistors. Simultaneously formed D-well and NPN base regions are also shown.

Referring to FIG. 1, a die portion 10 of a P-type multi die single crystal silicon wafer (not shown) is heated to grow a sacrificial oxide layer (not shown) on a major surface thereof. Apertures are formed in the oxide layer through which N-type impurity atoms are introduced that are to become N+ buried layers 12a and 12b. After a heating step to partially drive the N-type impurities into the die substrate 10, selective implantation of P-type impurities is effected by similar steps in substrate regions at which P-type isolation walls 13a portions and the NMOS P-well extension 17a are to be formed. After a heating step to partially drive the P-type impurities, an N-type epitaxial layer 14 about 4.5 m thick and of surface resistivity near 0.7 ohm-cm is grown on the substrate surface. A mask (not shown) is formed by which a selective ion implantation of P-type impurities is selectively introduced into the epitaxial surface to form the P-well 17b for an N-channel CMOS transistor and the top portions 13b of the P-type isolation walls. After removing the photoresist, the die 10 is heated again to further drive the implanted P-type impurities to form the P-well 17b and walls 13, and a blanket 100 Å thick oxide film 16 is simultaneously grown over the epitaxial layer 14.

At this early point in the method there have been formed the isolated epitaxial pockets 14a, 14b and 14c in which vertical DMOS, NPN and CMOS transistors, respectively, are yet to be formed.

A blanket layer of silicon nitride 18 of about 1100 Å thickness is then deposited over the oxide film 16. By a standard selective etching process, removal of portions of the nitride layer 18 and underlying film 16 is effected to leave patches of layers 18 and 16 corresponding respectively to the "device" area 20 of a high-current DMOS transistor, to the device area 21 of an NPN transistor, to the device area 22 of the N-channel CMOS transistor and to the device area 24 of the P-channel CMOS transistor. Also in that same selective etching process there are left isolated patches of the layers 16 and 18 in areas 26 over the P-type walls 13, and isolated patches of the layers 26 and 18 in areas 30 at which highly conductive N-type plugs are to be formed.

The die is heated in an air atmosphere to grow a pattern of a heavy field oxide 25, of at least 5000 Å and preferably about 12000 Å thickness. During this heating step, the selectively etched refractive nitride 18 is employed as a device-areas-mask to limit the growth of the thick field oxide 25 to the regions surrounding and outside of transistor device areas 20, 21, 22 and 24 as well as to regions surrounding special areas 26 and 30. This is the well-known LOCOS process.

Figure 5:
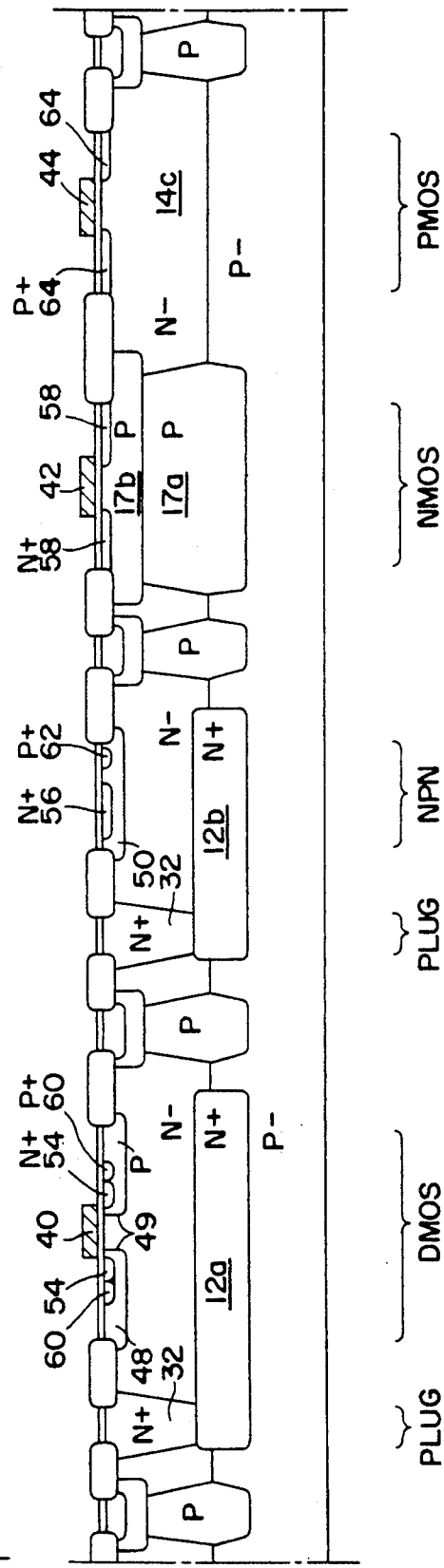
FIG. 5 shows the integrated circuit of FIG. 4 further developed with simultaneously formed DMOS source, NMOS source, NMOS drain and NPN emitter regions, as well as simultaneously formed D-well-contact, base contact, and PMOS source and drain regions. These figures are not drawn to scale.

A new photoresist mask (not shown) is formed with an aperture encompassing each special area 30 of the yet unformed N+ plugs 32 that are seen in FIGS. 3 through 5. The areas of silicon nitride 18, that are exposed via the two apertures in this photoresist mask, correspond to areas 30 that are now defined by the openings 34 in the field oxide 25. The silicon nitride 18 exposed through openings 34 in field oxide 25 is then etched away and subsequently the underlying silicon oxide 16 is chemically removed to expose epitaxial silicon in areas 30 as seen in FIG. 2.

The die 10 is then placed in a diffusion furnace where it is heated in a conventional phosphorous atmosphere using a POCl$_3$ source at 1100° C. for about 40 minutes. The phosphorous atoms are diffused into and through the epitaxial pockets 14a and 14b at areas 30 to form very low resistivity N-type plugs 32 at phosphorous densities of about $10^{21}$ atoms/cm$^3$. The plugs contact respectively the N-type buried layers 12a and 12b as depicted in FIG. 3. Subsequent heating steps are accounted for in advance such that this phosphorous diffusion step is aimed at forming finished plugs 32 having a phosphorous density of greater than $10^{20}$ atoms/cm$^3$. Thus the subsequent heating steps, mentioned below, have a low time-temperature product to minimize further diffusion of the phosphorous atoms in the plug 32.

During the extensive diffusion of phosphorous, the 1100 Å thick silicon nitride layer 18 and the 800 Å thick silicon dioxide layer 16 effectively mask and protect the device areas 20, 21, 22, 24 and 26 from being phosphorous doped. A grown silicon dioxide protective layer alone would have to be much thicker to prevent penetration of phosphorous at diffusion temperatures and times necessary to achieve the wanted high density phosphorous plugs. Such a very thick oxide would eventually have to be stripped which step would also remove a prohibitive amount of the LOCOS field oxide 25.

An alternative process for obtaining such a high concentration of N-type impurities would be to ion implant the plugs 32. However, that is quite expensive because the implanting equipment to achieve such high densities is so much more costly to use and because the throughput rate is lower, e.g. implanting one wafer at a time compared with the POCl$_3$ diffusion step in which a diffusion furnace may hold hundreds of wafers.

At the conclusion of a POCl$_3$ diffusion step, there has been formed a phosphorous glass (not shown) over the plug 32. The glass is then stripped away and an oxide 36 is grown over the plug 32 as is illustrated in FIG. 3.

Next the nitride layer 18 is chemically removed and a photoresist mask is formed having an aperture exposing the PMOS device area 24 but covering the other device areas 20, 21 and 22. A light channel adjust implant is then effected in the epitaxial PMOS area 24.

The resist is then stripped and the epitaxial surface at all device areas is cleared of all remaining oxide. This leaves silicon exposed in all device areas including MOS device areas 20, 21, 22 and 24 as well as isolation wall areas 26 and plug areas 30. A high quality gate oxide 38 is grown over the exposed silicon to a thickness of about 500 Å. This oxide 38 is to serve as the gate oxide in the DMOS, NMOS and PMOS transistors. The initial growth of the gate oxide 38 is accomplished in as short a time as possible preferably heating to less than 900° C., without threatening gate-oxide quality. The advantage of speed and avoidance of high temperatures during the initial period for growing the gate oxide 38 is (a) that early oxide coverage of the heavily doped and quick diffusing phosphorous in the plugs 32 and (b) that early coverage of MOS transistor device ares 20, 22 and 24, both assure that there will be no substantial autodoping of phosphorous from the plugs 32 into the channels of the MOS devices which could make the control of MOS device thresholds very difficult to achieve.

The preferred step employed for at least initially growing the gate oxide 38 at a high rate is pushing the room temperature substrate 10 into a chamber for 35 minutes at 3 inches/minute in which there has been established a temperature of 850° C. and gas flows of hydrogen at 0.64 liters/ minute, of oxygen at 0.80 l/m and of nitrogen at 7.2 l/m. The temperature is then ramped up for 15 minutes to 950° C. with the same gas mixture and held there for 60 minutes. The hydrogen and oxygen are then shut off for annealing in nitrogen only for 20 minutes at 950° C. after which the substrates are cooled. The 500 Å gate oxide layer 38 is now complete. Use of HCl is avoided. This low temperature pyrogenic partial-steam process grows an excellent gate quality oxide 38. In general, the gas mixture and the temperature may be changed during the growing of the gate oxide, but at least the pyrogenic partial steam at a low temperature e.g. <900° C. must be employed initially for growing at least the first hundred angstroms of oxide.

A blanket coating of polysilicon is deposited and selectively etched away to leave the DMOS gate 40, the NMOS gate 42 and the PMOS gate 44.

In a series of photomasking, boron-ion implantation and driving by heating steps, the annular P-type D-well 48 is formed at the same time that the NPN base 50 and contact regions 52 in the P-type isolation walls are formed.

The remainder of this method follows known procedures. The annular N+ source region 54 of the vertical DMOS transistor is self-aligned with the gate 40 so that the source 54 and the central hole 49 in the annular P-type D-well of the DMOS transistor are self-aligned with each other, as is described in the above-mentioned patent application to W. Huie et al. Also described are the steps necessary to form an annular P+ contact region 60 in the D-well 48. The NMOS transistor source and drain regions 58 as well as the emitter 56 of the NPN transistor are all formed simultaneously. Likewise, the P-type source and drain regions 64 of the PMOS transistor as well as the base contact region 62 of the NPN transistor are simultaneously formed with the P-type D-well contact region 60.

What is claimed is:

1. In a method for making an integrated circuit having a high-current transistor and a pair of CMOS transistors in which method a silicon die is initially provided having a P-type substrate, an N+ buried layer, an N-type epitaxial layer, and a network of P-type isolation walls in said epitaxial layer dividing said epitaxial layer into a plurality of isolated pockets wherein the improvement comprises:

(a) forming a nitride film over said epitaxial layer and removing portions of said nitride film to leave nitride patches over the device areas at which said high current transistor and CMOS transistors are to be formed, and another nitride patch closely adjacent but spaced from the patch covering said high-current-transistor device area;

(b) growing a heavy field oxide over portions of said epitaxial layer not covered by said nitride patches;

(c) selectively removing said another nitride patch exposing an uncovered area of epitaxial silicon and leaving said patches over said device areas at which said high current transistor and CMOS transistors are to to formed;

(d) heating said die in a phosphorous atmosphere to diffuse phosphorous atoms into said uncovered area but not said device areas which are masked by the device-area patches, for forming an N+ plug through said epitaxial layer and to said N+ buried layer;

(e) removing the remaining of said device-area nitride patches; and (f) forming said high current transistor, and said CMOS transistors.

2. The method of claim 1 wherein said heating and diffusing is terminated after said phosphorous atoms in said plug have reached a density of about $10^{21}$ atoms/cm$^3$.

3. The method of claim 1 wherein said heating in a phosphorous atmosphere is at a temperature of about 1100° C.

4. The method of claim 1 wherein said phosphorus atmosphere is comprised of POCl$_3$.

5. The method of claim 2 wherein said forming said high current transistors is accomplished by steps including exposure of said die to temperatures the duration and magnitude of which is ineffective in causing further substantial diffusion of said phosphorous atoms of said N+ plug.

6. The method of claim 1 wherein said high current transistor is a DMOS transistor.

7. The method of claim 6 wherein after said heating in a phosphorous atmosphere said forming said high current DMOS and said CMOS transistors comprises growing a layer of a gate oxide over said epitaxial layer at said device areas and over said N+ plug.

8. The method of claim 7 wherein said growing said gate oxide is accomplished at least initially by a partial steam pyrolysis step at less than 900° C. so that the initial growth is at a low temperature and a high rate to minimize autodoping from said plug to said device areas.

9. The method of claim 6 wherein said removing portions of said nitride film further includes leaving yet another patch over an area in which a vertical NPN transistor is to be formed and still another nitride patch over an area adjacent to said NPN device area, said removing said another nitride film patch further including removing said still another nitride film patch so that said diffusing phosphorous atoms is additionally into said area adjacent said NPN device for forming another N+ plug through said epitaxial layer.

* * * * *